United States Patent
Kar et al.

(10) Patent No.: US 7,776,630 B1
(45) Date of Patent: Aug. 17, 2010

(54) EXCITATION BAND-GAP TUNING OF DOPANT BASED QUANTUM DOTS WITH CORE-INNER SHELL OUTER SHELL

(75) Inventors: Soumitra Kar, Orlando, FL (US); Swadeshmukul Santra, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 12/686,552

(22) Filed: Jan. 13, 2010

Related U.S. Application Data

(62) Division of application No. 12/275,269, filed on Nov. 21, 2008, now Pat. No. 7,687,800.

(60) Provisional application No. 61/004,138, filed on Nov. 23, 2007.

(51) Int. Cl.
H01L 29/15 (2006.01)
G02F 1/017 (2006.01)

(52) U.S. Cl. .................. 438/22; 257/14; 257/E29.071; 977/773; 977/774; 438/962

(58) Field of Classification Search .................. 438/22, 438/962; 257/14, E29.071; 977/773–774
See application file for complete search history.

(56) References Cited

U.S. PATENT DOCUMENTS

2005/0129947 A1 6/2005 Peng

2005/0129957 A1* 6/2005 Kashiwagi et al. .......... 428/413
2009/0294692 A1* 12/2009 Bourke et al. ............ 250/459.1

OTHER PUBLICATIONS

Qian, et al., Applied Physics letters, 2008, pp. 093103, vol. 92.
Pengtao, et al., Journal of Applied Physics, 2009, pp. 044313-044313-5, vol. 105, issue 4.
Allwood, Magnetic Domain-Wall Logic,Science, 2005, pp. 1688-1692, retrieved on Jan. 7, 2008, retrieves from www.sciencemag.org.

(Continued)

*Primary Examiner*—Bradley K Smith
*Assistant Examiner*—Jami M Valentine
(74) *Attorney, Agent, or Firm*—Brian S. Steinberger; Joyce P. Morlin; Law Offices of Brian S. Steinberger, P.A.

(57) ABSTRACT

A composition and method for fabricating and tuning a dopant based core-shell semiconductor having a quantum dot core with an excitation band-gap are provided. A quantum dot core composed of an alloy of cadmium sulfide (CdS) and zinc sulfide (ZnS) as semi-conductor materials include a dopant of manganese (Mn) added to the core and an outer shell of zinc sulfide (ZnS). The dopant based core/shell quantum dot semiconductor of the present invention allows the fine tuning of an excitation band-gap, covering a wide range (from 2.4 eV to ~4 eV). When doped with Mn, these alloy Qdots emit bright yellow/orange light. Tuning of the excitation band is accomplished by changing the alloy composition of the core. Based on photophysical studies a new core/shell/shell model is provided, in place of the traditional core/shell model. Due to the interfacial diffusion of the cations from the core and shell an intermediate alloy layer is formed providing an inner shell; this inner shell layer is the real host of the dopant ions.

6 Claims, 9 Drawing Sheets

OTHER PUBLICATIONS

Archer, Direct Observation of sp-d Exchange Interactions in Colloidal Mn- and Co-Doped CdSe Quantum Dots, Nano Letters, 2007, pp. 1037-1043, vol. 7.

Yang, GdIII-Functionaled Fluorescent Quantum Dots as Multimodal Imaging Probes, Advance Materials, 2006, pp. 2890-2894, vol. 118.

Bhargava, Optical Properties of Manganese-Doped Nanocrystals of ZnS, Physical Review letters, 1994, pp. 416-425, vol. 72, No. 3.

Biswas, Optical and Magnetic Properties of Manganese-Incorporated Zinc Sulfide Nanorods Synthesis by a Solvothermal Process, Journal of Physical Chemistry B, 2008, pp. 17525-17530, vol. 109.

Yang, Efficient and Photostable ZnS-Passivated CdS:Mn Luminescent Nanocrystals, Advanced Functional Materials, 2004, pp. 152-156, vol. 14, No. 2.

Yang, CdS:Mn Nanocrystals Passivated by ZnS: Synthesis and Luminescent Properties, Journal of Chemical Physics, 2004, pp. 10233-10240, vol. 121, No. 20.

Santra, Rapid and Effective Labeling of Brain Tissue Using TAT-Conjugated CdS:Mn/ZnS Quantum Dots, Chemical Communications, 2005, pp. 3144-3146.

Santra, Synthesis of Water-Dispersible Fluorescent, Raio-Opague, and Paramagnetic CdS:ZnS Quantum Dots: A Multifuntional Prove for Bioimaging, Journal of the American Chemical Society, 2005, pp. 1656-1657, vol. 127, No. 6.

Nag, A Study of Mn Doping in CdS Nanocrystals, Chemistry of Materials, 2007, pp. 1656-1657, vol. 19, No. 13.

Nag, To Dope Mn in a Semiconducting Nanocrystal, Journal of the American Chemical Society, 2008, pp. 10605-10611, vol. 130, No. 32.

Yang, Enhanced Photoluminescence from CdS:Mn/ZnS Core/Shell Quantum Dots, Applied Physics Letters, 2003, pp. 1965-1967, vol. 82, No. 12.

Hsu, One-Step Preparation of Coaxial CdS-ZnS and Cd1-xZnxS-ZnS Nanowires, Advanced Functional Materials, 2005, pp. 1350-1357, vol. 15.

Khefacha, Electrical and Optical Properties of Cd1-xXnxS Grown by Chemical Bath Deposition, Journal of Crystal Growth, 2004, pp. 400-409, vol. 260.

Ahrenkiel, The Effect of Deep States on the Photovoltaic Performance of CdZnS/CuInSe2 Thin Film Devices, Solar Cells, pp. 549-565, vol. 16, abstract, (Accepted Aug. 1985 Available online Feb. 2003).

* cited by examiner

Figure 7a
Figure 7b
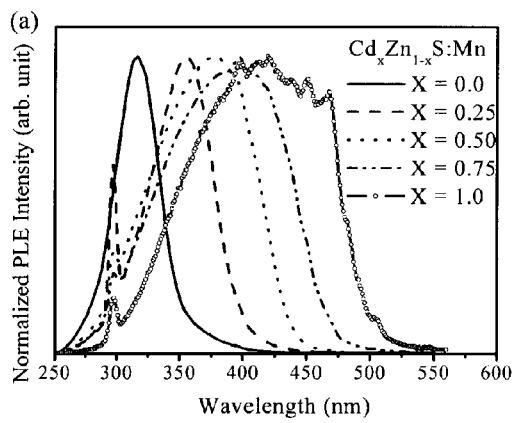
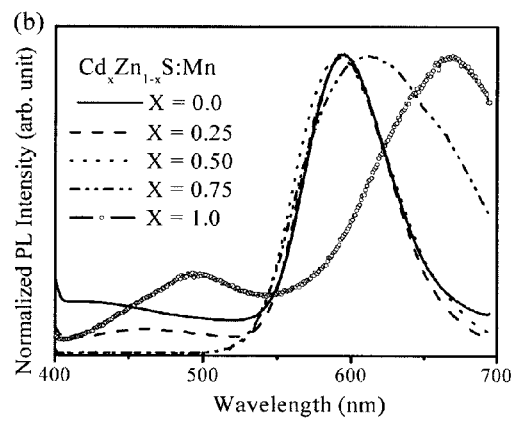
Figure 7c
Figure 7d
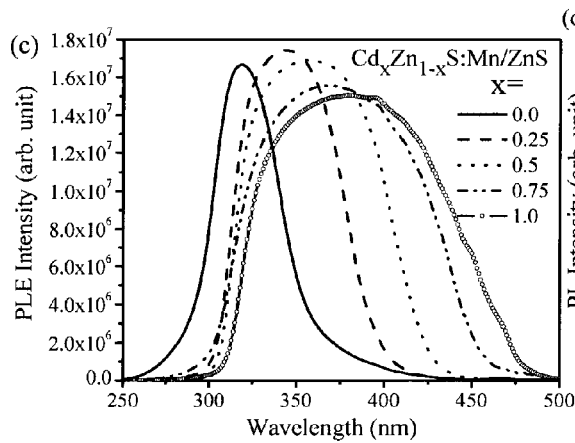
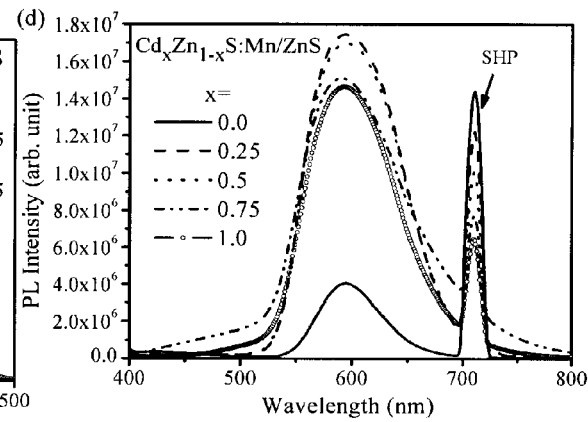

EXCITATION BAND-GAP TUNING OF DOPANT BASED QUANTUM DOTS WITH CORE-INNER SHELL OUTER SHELL

This is a divisional application of U.S. patent application Ser. No. 12/275,269, filed Nov. 21, 2008 now U.S. Pat. No. 7,687,800 and claims priority based on U.S. Provisional Application Ser. No. 61/004,138 filed on Nov. 23, 2007, the contents of which are incorporated herein by reference.

FIELD OF THE INVENTION

This invention relates to fluorescent (or luminescent) quantum dots in the field of nano-technology, and in particular to, tunable dopant based core/shell/shell quantum dots having a broad excitation spectrum, compositions and methods of fabricating. The research herein was supported in part by the National Science Foundation (NSFCBET-63016011 and NSF-NIRT Grant EEC-056560).

BACKGROUND AND PRIOR ART

Core/shell semiconductor quantum dots (Qdots) have attracted enormous research interest in the field of electronics, optoelectronics and bioimaging. To further diversify core/shell Qdot applications, especially in the field of spintronics, dopant based Qdots are of particular interest. By doping traditional CdS or ZnS core with transition metal ions such as manganese (Mn), cobalt (Co), nickel (Ni) and the like, it is possible to develop dilute magnetic semiconductor (DMS) Qdots for spintronic applications as reported in recent scientific articles written by D. A. Allwood et al in *Science* 2005 Vol. 309, pages 1688-1692 and P. I. Archer in *Nano Letters* 2007 Vol 7, pages 1037-1043, for example.

It is expected that these dopant based binary DMS Qdots will advance the capability of the next generation memory storage devices and computers. In this context, it is important to synthesize dopant based ternary DMS Qdots, such as manganese (Mn) dopant based $CdxZn_1-xS:Mn/ZnS$ Qdot heterostructures.

Fluorescent quantum dots (Qdots) have demonstrated their potential in diagnostic bioimaging applications in vitro as discussed by H. Yang et al. in *Advanced Materials* 2006, Vol. 18, page 2890. For in vivo bioimaging applications, however, the embodiment of additional properties such as paramagnetism into the same fluorescent probe is highly desirable. These multimodal probes would benefit in vivo disease diagnosis and surgical guidance based on their ability to be detected in multiple modes, such as, optically and magnetically. Thus, synthesis of bright multimodal Qdots is a matter of great interest to a broad area of the scientific community from physics to bioscience.

The wide band gaps of the II-VI group semiconductors such as CdS and ZnS serve as good host materials for various kinds of foreign elements known as dopants. Out of the different transition metals, manganese usually occupies cadmium (Cd) or zinc (Zn) substitutional sites in the host lattice as a divalent ion. The excitation and decay of manganese ion produces a yellow/orange luminescence at approximately 590 nm wavelength, as reported by R. N. Bhargava et al in *Phys. Rev. Lett.* 1994, Vol. 72, page 416 and S. Biswas et al. in *Journal of Physical Chemistry B*, 2005, Vol. 109, 17256. This emission peak is generally associated with a transition between $^4T_1$ and $^6A_1$ energy levels. Also, the presence of the $Mn^{2+}$ ions within the host Qdots introduces the paramagnetic property.

The realization that many molecular phenomena result in mechanical responses at the nanoscale level promises to bring about a revolution in the field of chemical, physical, and biological applications. In a quest for smaller, faster, better, more accurate measuring and analytical devices there has been a wide application of traditional dopant based Qdots, particularly in biomedical imaging. However, the applications are limited because of a relatively narrow excitation range, typically in the UV range between 200-375 nm wavelengths.

In spite of the many advantages of dopant based quantum dot semiconductors disclosed in scientific applications today, there are limitations and disadvantages of the existing quantum dots regarding their adaptability and reconfigurablility. For example, traditional dopant based Qdots in biomedical imaging with a relatively narrow excitation range between 200-375 nm wavelengths is extremely harmful for biological systems as excitation in this wavelength range can easily destroy live cells. Again, due to narrow excitation ranges, these Qdots will not be efficient for capturing a broad spectrum of solar light. Ideally, Qdots with broad excitation bands will eliminate the above-mentioned limitations of traditional dopant based Qdots.

The performances of the QDots are often influenced by their surfaces since an appreciable portion of the constituent atoms reside at their surfaces for example, for a QDot with a diameter of 4 nm, 30% of its atoms reside on the surface and thus are missing one or more of their four (tetrahedral) bonds to neighboring atoms. Chemically passivating these surface atoms and providing them with a true tetrahedral bonding environment plays a significant role in determining the optical and electronic properties of the QDot.

A significant improvement in the performances of the QDots was realized by growing a semiconductor shell around the core compared to the organic surface capping ligands traditionally used to chemically passivate the QDot surface as discussed by H. Yang et al. in *Advanced Functional Materials* 2004, 14, 152 and H. Yang et al. in *Journal of Chemical Physics* 2004, 121, 10233. Of the various types of QDots, Mn-doped II-VI QDots are of special attraction owing to their bright luminescence at room temperature in the visible region. Also, presence of the Mn ion as a transition metal ion in the semiconductor host make them dilute magnetic semiconductor (DMS), an interesting materials for application in the field of spintronics. Especially, the Mn doped type I core-shell semiconductors are suitable for bio-imaging applications due to the large Stoke's shift in the emission spectra as discussed by S. Santra et al. in *Chemical Communications* 2005, 3144; S. Santra et al. in *Journal of the American Chemical Society* 2005, 127, 1656, and H. S. Yang et al. in *Advanced Materials* 2006, 18, 2890.

Performances of these doped semiconductors both as fluorescent as well as spintronics materials depends on the position and distribution of the Mn atoms inside the host lattice. Doping in the semiconductor nanocrystals are often encountered with various difficulties due to various reasons including various kinetic factors, preferential adsorption through specific surfaces etc. Difference in the ionic radii of the substituent dopant and the substituted cation often introduces significant amount of strain in the nanocrystal lattice; since strain fields are necessarily long range, much longer than typical nanocrystal dimensions, it tends to relieve itself by ejecting the dopant to the surface of the nanocrystals. Thus, it is extremely important to investigate the positions of the Mn atoms inside a traditional CdS:Mn/ZnS core/shell QDot.

The dopant based core-shell semiconductor quantum dots (Qdots) of the present invention solve many problems and overcome many limitations in the prior art through alloying between the CdS and ZnS phase and providing a different atmosphere to the substituent dopant.

SUMMARY OF THE INVENTION

The first objective of the present invention is to provide a dopant based core/shell/shell semiconductor quantum dot (Qdot) with a broad spectrum excitation range.

The second objective of the present invention is to provide a tunable dopant based core/shell/shell semiconductor quantum dot (Qdot) with a broad spectrum excitation range.

The third objective of the present invention is to provide a dopant based core/shell/shell semiconductor quantum dot (Qdot) efficient for capturing a broad spectrum of solar light.

The fourth objective of the present invention is to provide a dopant based core/shell/shell semiconductor quantum dot (Qdot) having a Qdot core with an alloy of two semiconductor materials selected to possess very similar crystal structure with minimal lattice mismatch and luminescence excitation spectra that partially overlap.

The fifth objective of this invention is to provide a dopant based core/shell/shell semiconductor quantum dot (Qdot) wherein the excitation band is tuned by changing the alloy composition of the Qdot core.

The sixth objective of this invention is to provide a dopant based core/shell/shell semiconductor quantum dot (Qdot) useful as a high-performance solar cell absorber material.

The seventh objective of the invention is to provide a dopant based core/shell/shell semiconductor quantum dot (Qdot) useful in sensitive ultra-small bioimaging probes.

The eighth objective of the invention is to provide a dopant based core/shell/shell semiconductor quantum dot (Qdot) useful as efficient electroluminescent (phosphor) material.

The ninth objective of the invention is to provide a dopant based core/shell/shell semiconductor quantum dot (Qdot) useful in Spin-Based electronics (spintronics).

A tenth objective of the invention is to redesign the QDot structures wherein manganese (Mn) dopant atoms reside in an intermediate alloy layer of $Cd_xZn_{(1-x)}S$ formed in-situ at the interface of the core and shell of QDots.

An eleventh objective of the invention is to provide a CdS/$Cd_xZn_{1-x}S$:Mn/ZnS core/shell/shell model in place of the traditional CdS:Mn/ZnS core/shell QDots.

A preferred dopant based core/shell/shell semiconductor having a quantum dot core with a tunable excitation band-gap includes a concentric arrangement of an alloy of cadmium sulfide (CdS) and zinc sulfide (ZnS) semiconductor materials in a core, a concentric layer composed in situ formed $Cd_xZn_{(1-x)}S$ alloy embedded with the dopant manganese (Mn) forming an inner shell or interfacial layer surrounding the core, and an outer shell of zinc sulfide (ZnS).

The more preferred dopant based core/shell/shell quantum dot core includes an alloy of CdS and ZnS that varies from an approximately 100% ZnS core to an approximately 100% CdS core, when the alloy is approximately 100% of ZnS and approximately 100% CdS, there is interfacial diffusion of Cd and Zn atoms forming an additional interfacial alloy.

The more preferred dopant based core/shell/shell quantum dot core includes an alloy of CdS and ZnS and the dopant of Mn having a composition selected from at least one of ZnS:Mn, $Zn_{0.75}Cd_{0.25}S$:Mn, $Zn_{0.50}Cd_{0.50}S$:Mn, $Zn_{0.25}Cd_{0.75}S$:Mn, and CdS:Mn.

The dopant based core/shell/shell quantum dot semiconductor of the present invention has an inner shell dopant that is only manganese (Mn) and the outer shell that is only zinc sulfide (ZnS).

The quantum dot core of the present invention has a core/shell/shell particle size that is between approximately 3.0 nanometers (nm) to approximately 3.5 nanometers (nm) in diameter with a core approximately 2.0 nanometers (nm) to approximately 2.7 nanometers (nm) in diameter.

Further, the dopant based core/shell/shell semiconductor with quantum dot core of the present invention has an excitation spectrum that is in a wavelength range from approximately 275 nm to approximately 490 nm and the excitation spectrum is efficient for capturing a broad spectrum of solar light.

The tuning of the excitation band of the dopant based core/shell/shell semiconductor of the present invention is accomplished by changing the alloy composition of the core; the core is an alloy and the composition of the interfacial alloy layer varies depending on the percentage of Cd and Zn inside the core.

A preferred method for fabricating a dopant based core/shell/shell semiconductor having a quantum dot core with a tunable excitation band-gap includes selecting an acetate precursor of semiconductor materials having identical crystal structures with minimal lattice mismatch, adding a bivalent transition metal ion as a dopant, mixing the acetate precursor of semiconductor material and bivalent transition metal ion dopant in a first water-in-oil emulsion at room temperature, mixing a sulfide ion source in a second water-in-oil emulsion at room temperature, combining the first water-in-oil emulsion with the acetate precursor of semiconductor material and bivalent transition metal with the second water-in-oil emulsion containing the sulfide ion source, at room temperature to form a quantum dot (Qdot) alloy core, and growing an outer semiconductor material shell layer about the Qdot core to form a ternary alloy core/shell/shell dopant based quantum dot semiconductor.

The preferred precursor materials are zinc acetate, cadmium acetate and manganese acetate. The preferred sulfide ion source is sodium sulfide. The preferred bivalent transition metal ion dopant is manganese (Mn), cobalt, (Co), and nickel (Ni), more preferably, bivalent transition metal ion dopant is manganese (Mn).

The preferred method for fabrication quantum dots in the present invention provides QDots wherein the average size of the ternary alloy core/shell/shell dopant based quantum dot semiconductor is in a range between 3 nm and 4 nm in diameter.

Further objects and advantages of this invention will be apparent from the following detailed description of a presently preferred embodiment that is illustrated schematically in the accompanying drawings.

BRIEF DESCRIPTION OF THE FIGURES

FIG. 7a shows the PLE spectra of $Cd_xZn_{1-x}S$:Mn QDots.

FIG. 7b shows the PL spectra of $Cd_xZn_{1-x}S$:Mn QDots.

FIG. 7c shows the PLE spectra of $Cd_xZn_{1-x}S$:Mn/ZnS QDots.

FIG. 7d shows the PL spectra of $Cd_xZn_{1-x}S$:Mn/Zns QDots.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Abbreviations and selected terms used herein are explained below:

Core/shell/shell is used herein to mean a concentric arrangement of the quantum dot structure, wherein there is a central core surrounded by an inner shell or interfacial layer that is then surrounded by an outer shell.

CdS is the chemical formula for cadmium sulfide.

Mn is the chemical symbol for manganese.

QDot is an abbreviation understood in the industry for quantum dot.

ZnS is the chemical formula for zinc sulfide.

The present invention is a method for fabricating and tuning a dopant based core/shell/shell semiconductor having a quantum dot (Qdot) core with a tunable excitation band-gap. The inner shell is formed in situ by the interfacial diffusion of the cations from the core and shell parts.

The present invention pertains to a novel design of the Qdot core. Unlike the traditional dopant-based, as well as, non-dopant based core/shell Qdots, the present Qdot core is atomically engineered to obtain a broad excitation spectrum. This is achieved by making the Qdot core an alloy of two semiconductor materials. These two semiconductor materials were selected in such a way that they possess very similar crystal structure with minimal lattice mismatch and their luminescence excitation spectra partially overlap. Thus, by changing the alloy composition of the Qdot core, the excitation band of the Qdot can be tuned, providing a tunable dopant based core/shell semiconductor Qdot.

Figure 1:
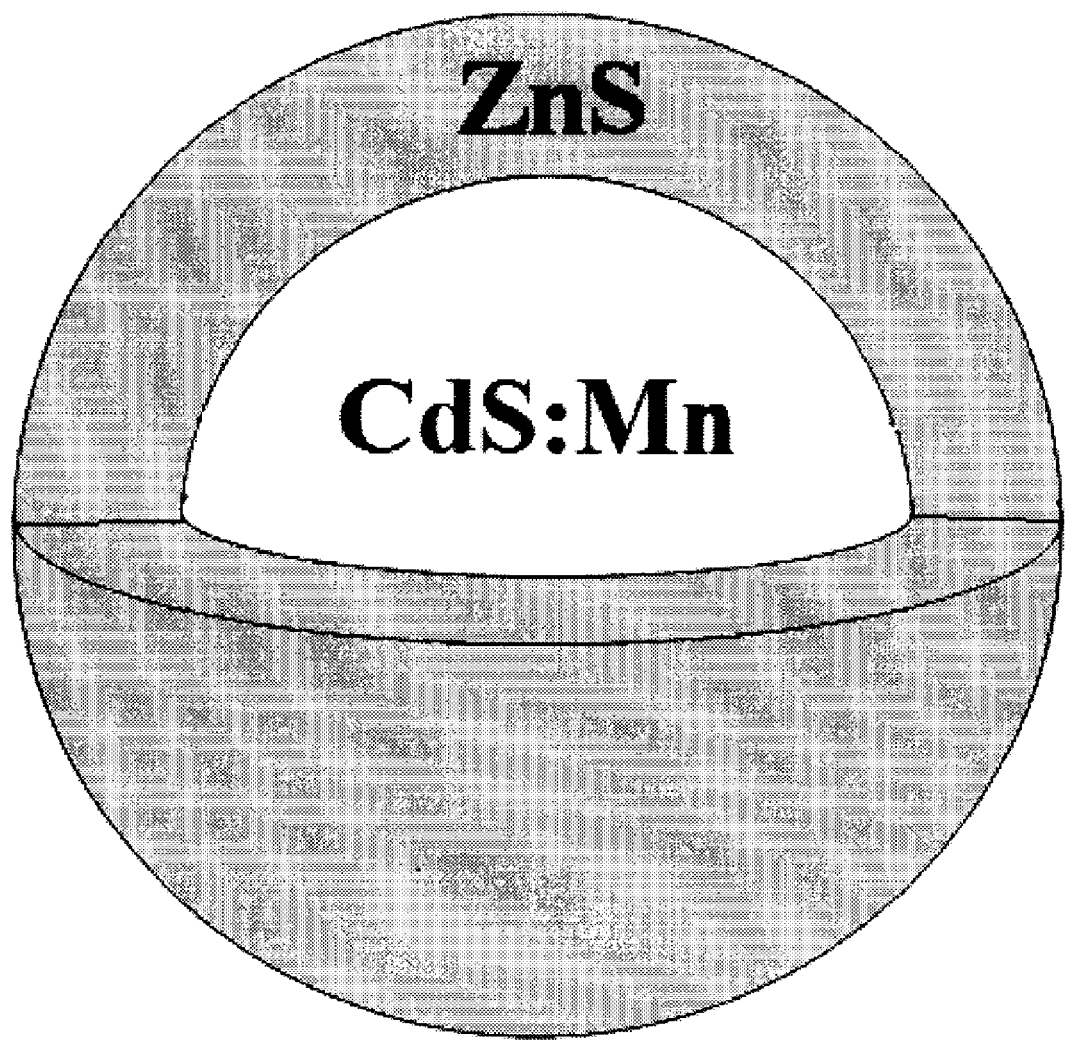
FIG. 1 is a structural model of a conventional core/shell CdS:Mn/ZnS Qdot. (Prior Art)
Figure 2:
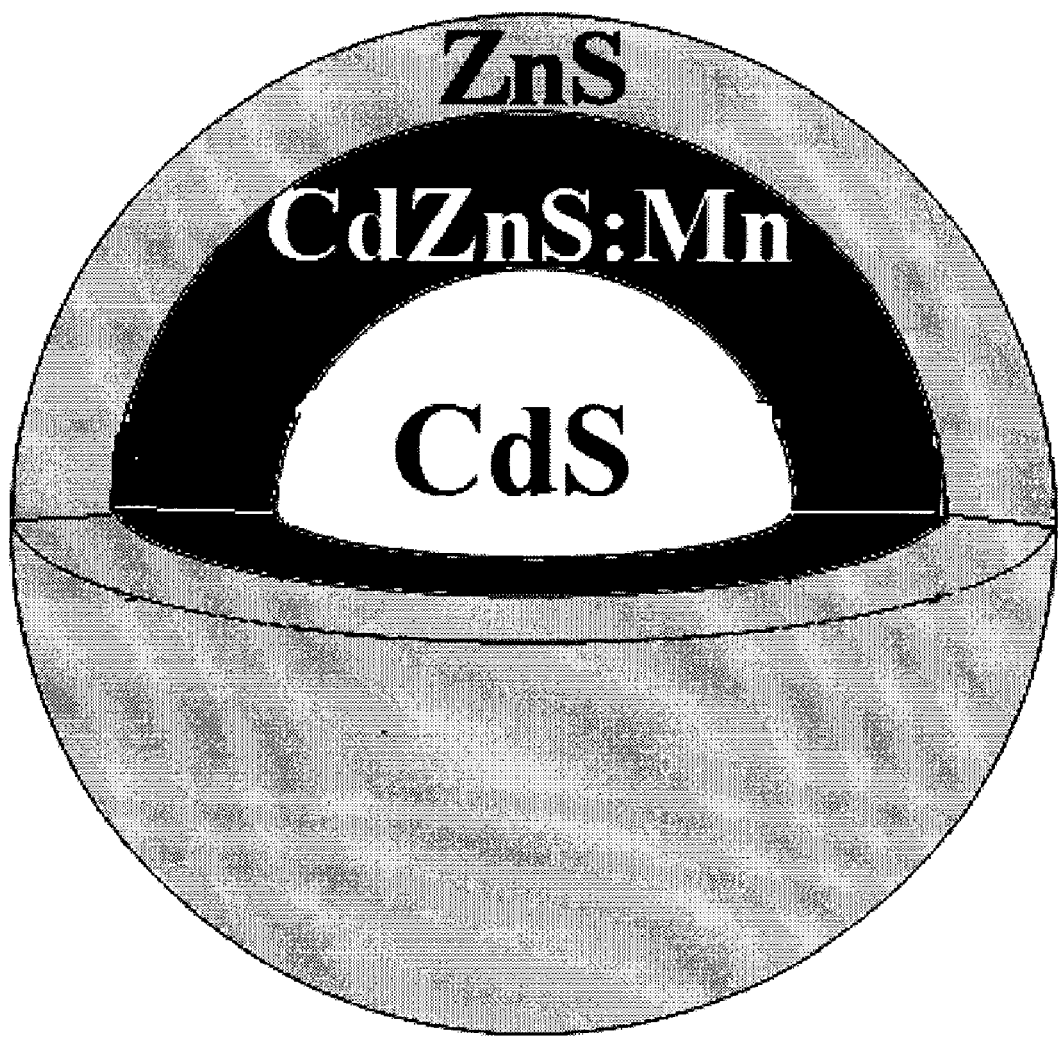
FIG. 2 is a structural model of a CdS/$Cd_xZn_{1-x}S$:Mn/ZnS core/shell/shell of the present invention.

FIG. 1 is a structural model of a conventional core/shell CdS:Mn/ZnS Qdot. The core consists of cadmium sulfide (CdS) with manganese (Mn) dopant and an outer shell of zinc sulfide (ZnS). In FIG. 2, the new novel core/shell/shell model replacing the traditional core/shell model of the QDot structure proposed in the present invention is shown. In the present invention the alloy composition of the core is varied from 100% ZnS core to 100% CdS core and can be represented by the general alloy composition: $Cd_xZn_{(1-x)}S$, and used in the detailed discussion below. The composition of the inner shell, formed in situ by the interfacial diffusion of the cations from the core and shell parts depends on the composition of the core as shown in FIG. 2. The preferred site for the dopant Mn ions is the interfacial alloy CdZnS layer. This alloy layer is radially positioned in between the core and 100% zinc sulfide (ZnS) layer.

The manganese (Mn) dopant in the core/shell/shell structure for Qdots provides bright luminescence.

For fabricating core/shell/shell Qdot hetero-nanostructure, the II-VI group semiconductors, such as cadmium sulfide (CdS) and zinc sulfide (ZnS) are attractive. Both the CdS and ZnS semiconductors have identical crystal structures with minimal lattice mismatch. Moreover, band-gap energy of ZnS (3.6 eV for bulk) is higher than CdS (band gap 2.4 eV for the bulk), making ZnS appropriate as shell material for synthesizing core-shell CdS/ZnS nanostructures.

Cadmium sulfide (CdS) is one of the most studied nanostructures for its wide range of applications in electronics (such as nano-laser, thin film transistor, etc.) and optoelectronics waveguide, photonic circuit element, photovoltaic materials, solar cells and the like, as reported in scientific literature. Furthermore, for spintronic applications, a new type of DMS materials could be developed by doping/co-doping of CdS with bivalent transition metal ions, such as manganese (Mn), cobalt (Co), nickel (Ni) and the like.

To demonstrate the engineering aspect of the above-mentioned core/shell/shell hetero-nanostructures, in the present invention, a new type of Mn dopant based core/shell $Cd_xZn_{(1-x)}S$:Mn/ZnS Qdot is fabricated wherein the core is engineered to form an alloy. The Qdot core engineering involved the modification of the binary semiconductor core composition, such as ZnS:Mn or CdS:Mn, to form a ternary alloy semiconductor core having the composition: $Cd_xZn_{(1-x)}S$:Mn.

A similar $Cd_xZn_{(1-x)}S$ ternary alloy structure is reported in the literature and is related to thin film compound semiconductor technology; Hsu et al. in *Advanced Functional Materials* 2005, Vol. 15, 1350-1357; Z. Khefacha in *Journal of Crystal Growth* 2004, Vol. 260, 400-409; R. Ahrenkiel, *Solar Cells* 1986, Vol. 16, 549-565.

However, the inventors herein are the first to fabricate dopant based core/shell/shell Qdots having a ternary alloy semiconductor core.

Figure 3:
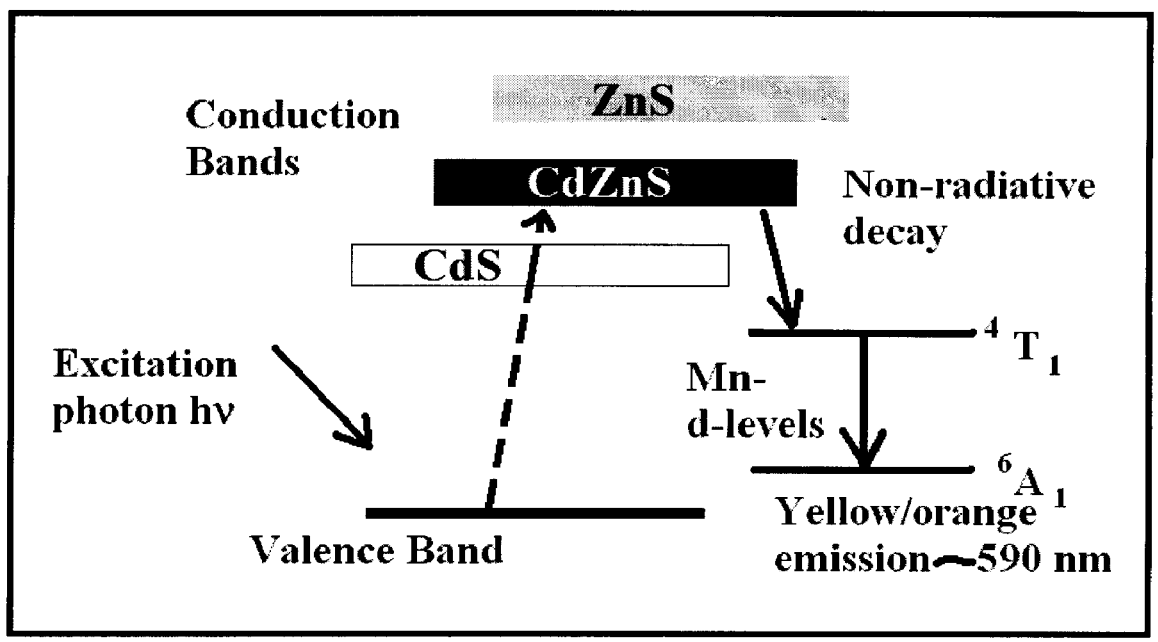
FIG. 3 is the CdS/$Cd_xZn_{1-x}S$:Mn/ZnS core/shell/shell model showing excitation properties of the dopant based core-shell semiconductor quantum dot (Qdot) of the present invention.

FIG. 3 is a schematic representation of emission properties ascribed to conventional QDot semiconductor materials when the core composition consists of an alloy of CdS and ZnS with a graphic representation of expanded photoexcitation and luminescence pathways made possible by the ternary alloy semiconductor core of the present invention, having the composition $Cd_xZn_{(1-x)}S$:Mn.

Upon excitation of the dopant based core-shell Qdots with external photons, the energetic electron could be promoted to the conduction band of the CdS core, or $Cd_xZn_{(1-x)}$ layer or outer ZnS layer. Electrons from all these conduction bands could populate the $^4T_1$ level of the Mn-d levels via non-radiative decay. These excited electrons annihilate via radiative transition between $^4T_1 \Rightarrow ^6A_1$ giving rise to bright yellow/orange emission at ~590 nm.

With dopant Mn atoms residing in an intermediate alloy layer $Cd_xZn_{1-x}S$ and formed in-situ at the interface of the core and shell of the QDots a $Cd_xZn_{1-x}S/Cd_yZn_{1-y}S:Mn/ZnS$ core/shell/shell model is prepared and analyzed for replacement of traditional CdS:Mn/ZnS QDots.

Figure 4A:
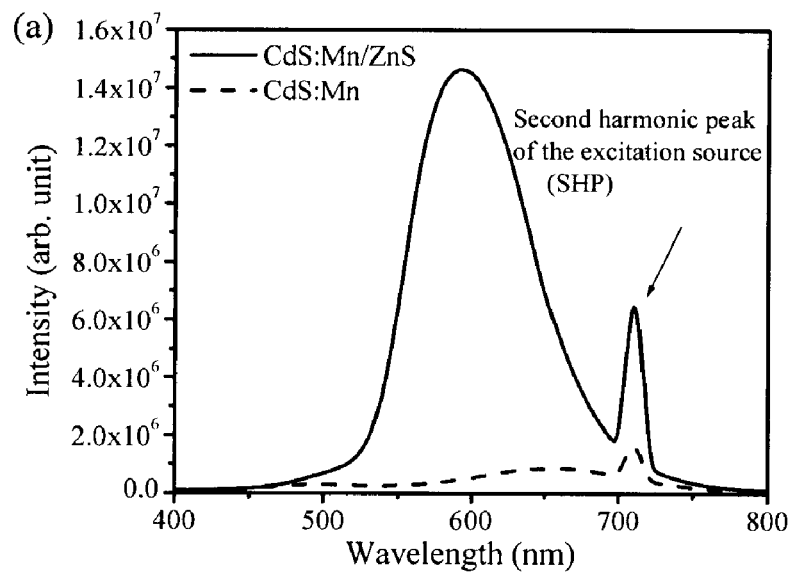
FIG. 4*a* is the photoluminescence (PL) spectra of CdS:Mn and CdS:Mn/ZnS QDots.

The samples were characterized by room temperature photoluminescence (PL) and photoluminescence excitation (PLE) measurements. FIG. 4a depicts the PL spectra of the Mn doped CdS quantum dots before and after the surface passivation through inorganic ZnS shell. As expected, a significant increase of luminescence intensity was observed upon the ZnS shell layer deposition on the CdS:Mn QDot surface.

Figure 4B:
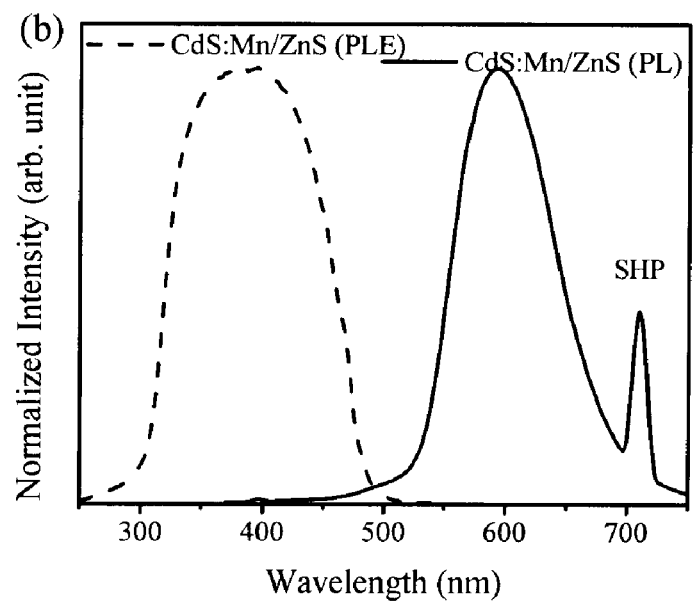
FIG. 4*b* is a graph of both the photoluminescence (PL) spectra and the photoluminescence excitation (PLE) spectra of the CdS:Mn/ZnS QDots.

FIG. 4b shows the room temperature PL and PLE spectra of the CdS:Mn/ZnS QDots exhibiting a strong emission at 592 nm corresponding to the $Mn^{2+}$ $^4T_1 => ^6A_1$ d-d ligand-field transition. The PLE spectrum depicted in FIG. 4b is quite broad with half width at full maximum (FWHM) ~140 nm. Similar broad PLE spectrum was also reported earlier for CdS:Mn/ZnS QDots prepared by following similar synthesis protocol as that of this work.[14] Authors have attributed the broadening of the peak to the size distribution of the particles. But, the TEM image provided in the same article showed the formation of quite moodispersed particles indicating that the PLE spectral broadening is perhaps not only due to the size distributions.

Another interesting observation made in FIG. 4a is that the incorporation of the shell layer not only caused the PL enhancement but also a clear peak position shift. With a view to investigate the effect of the shell layer a series of samples CdS:Mn, CdS:Mn/CdS and CdS:Mn/ZnS were synthesized with the same W value (molar ratio of $H_2O$ to AOT). The W value was purposefully kept constant as it was supposed to be the responsible factor for the particle size in reverse microemulsion system.

Figure 5A:
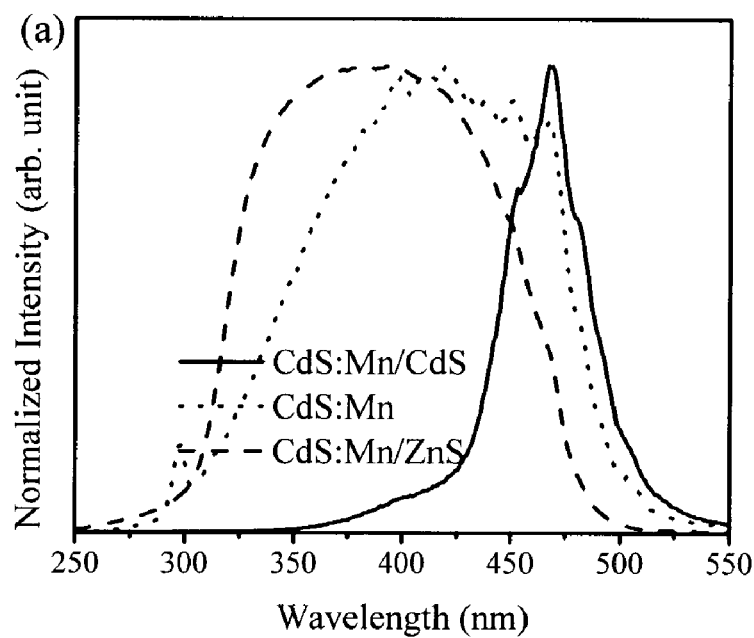
FIG. 5*a* shows the photoluminescence excitation (PLE) spectra of CdS:Mn, CdS:Mn/CdS and CdS:Mn/ZnS QDots.
Figure 5B:
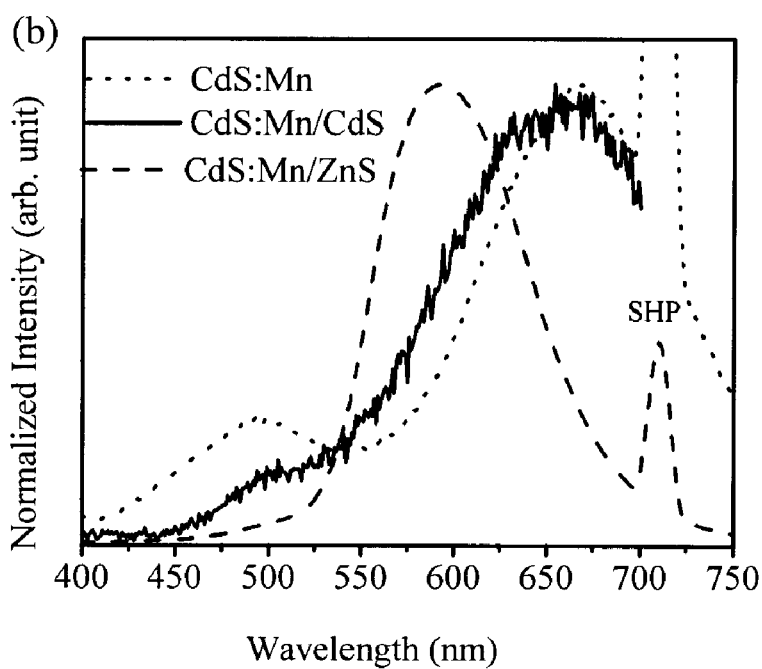
FIG. 5b shows the photoluminescence (PL) spectra of CdS: Mn, CdS:Mn/CdS and CdS:Mn/ZnS QDots.

FIGS. 5a and 5b show the PLE and PL spectra of the CdS:Mn, CdS:Mn/CdS and CdS:Mn/ZnS QDots. The PLE spectra of the samples presented quite a few surprises which further disagree with the previous explanation that the PLE broadening is due to the size distribution of the QDots. The PLE spectrum of the CdS:Mn QDots presented a broad plot (FWHM ~135 nm) with absorption edge at ~466 nm.

The PLE spectrum of the CdS:Mn/CdS QDots is quite sharp plot with FWHM ~42 nm. The PLE spectrum of the CdS:Mn/CdS QDots is little bit red shifted compared to the CdS:Mn QDots. This could be attributed to the increase of the particle size due to the formation of the shell layer of the same CdS material as that of the core host material. But the sharpening of the PLE spectra of the CdS:Mn/CdS QDots is surprising if we consider the broad PLE spectra of the CdS:Mn QDots is due to the size distribution. This is because, if at all there exists a size distribution in the uncoated CdS:Mn QDots, the shell layer is very unlikely to eliminate the size distribution. The shell layer is supposed to be of uniform thickness for all the individual particles and hence putting a shell layer on a poly dispersed particle system can not produce a monodisperse core/shell particle system.

The second surprise came form the PLE spectrum of the CdS:Mn/ZnS QDots in comparison with the uncoated CdS:Mn QDots. Although both the spectra are equally broad the spectrum for the CdS:Mn/ZnS QDots is quite a bit (~35 nm) blue shifted compared to the uncoated samples. Since putting the shell layer always increase the particle size a blue shift which is in contrary to the expectation. Thus despite the increase of the particle size, an increase in the energy gap for the CdS:Mn/ZnS QDots indicated some changes in the electron transition route inside the core. This is because in type I semiconductor core/shell materials such as CdS/ZnS electronic transitions are supposed to be confined within the core materials.

FIG. 5b shows the peak normalized PL spectra of the CdS:Mn, CdS:Mn/CdS and CdS:Mn/ZnS QDots. All the spectra were peak normalized with a view to compare their peak positions. The spectra shows that CdS:Mn and CdS:Mn/CdS QDots exhibited red light emission property with peak position at ~670 nm whereas the CdS:Mn/ZnS QDots exhibited a yellow/orange emission at ~592 nm. This observation again indicated a change in the Mn environment i.e. in the core of the QDots upon ZnS shell layer coating.

Figure 6A:
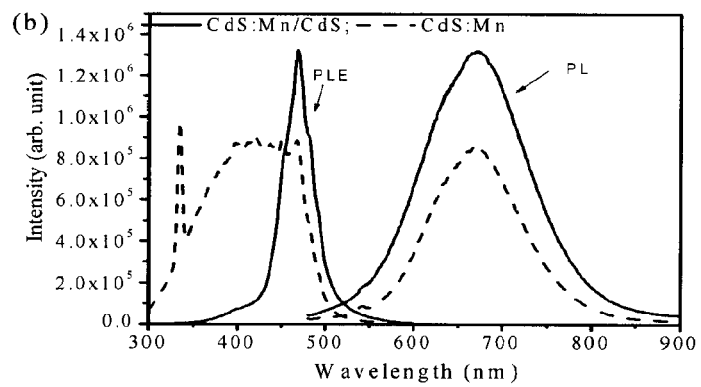
FIG. 6a shows both the photoluminescence (PL) and photoluminescence excitation (PLE) spectra of ZnS:Mn and ZnS:Mn/ZnS QDots.

In order to understand the changes in the PL and PLE spectra of the CdS:Mn/ZnS QDots, photoluminescence studies were also carried out on ZnS:Mn, ZnS:Mn/ZnS, CdS:Mn and CdS:Mn/CdS QDots synthesized under identical conditions. FIG. 6a depicts the PL and PLE spectra of the ZnS:Mn and ZnS:Mn/ZnS QDots. The PLE spectra for both the uncoated and coated samples exhibited a sharp peak at ~316 and 321 nm respectively. The red shift in the PLE spectrum of the coated sample is due to the increase in the particle size. The PL of both the uncoated and coated sample show a yellow/orange emission band at ~592 nm corresponding to the $Mn^{2+}$ $^4T_1 => ^6A_1$ d-d ligand-field transition. The coated sample shows improved PL intensity compared to the uncoated sample.

Figure 6B:
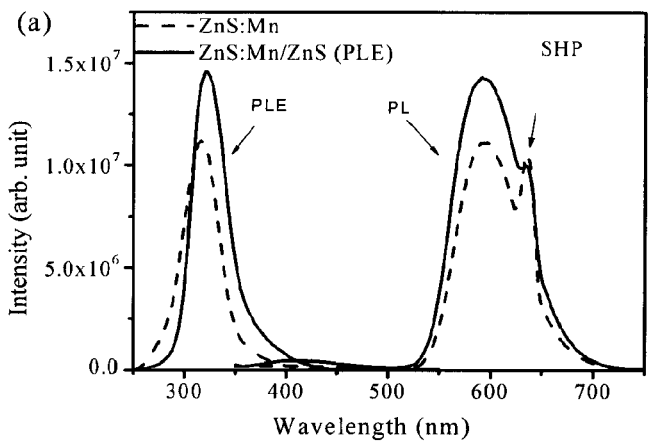
FIG. 6b shows the photoluminescence (PL) and photoluminescence excitation (PLE) spectra of CdS:Mn and CdS: Mn/CdS QDots.

FIG. 6b shows the PLE and PL spectra of the CdS:Mn and CdS:Mn/CdS QDots recorded with emission wavelength 670 nm and excitation wavelength 468 nm respectively. The PLE spectra of the CdS:Mn QDots are broad compared to the CdS:Mn/CdS QDots as discussed earlier. Both the CdS:Mn and CdS:Mn/CdS QDots exhibited red emission at ~670 nm and no peak position shift was observed upon putting the same material (CdS) as the shell layer over the host core (CdS) material. Again this red emission from the CdS:Mn and CdS:Mn/CdS QDots are also attributed to the same $Mn^{2+}$ $^4T_1 => ^6A_1$ d-d ligand-field transition.

Red light emission for the CdS:Mn nanoparticles are reported by A. Nag et al. in *Chemistry of Materials* 2007, 19, 3252. The red shift in the PL peak position for the CdS:Mn compared to the ZnS:Mn QDots could be explained in terms of crystal field splitting of the Mn d levels. Origin of the Mn related emission peak is attributed to the spin flip transition of $3d^5$ electron of $Mn^{2+}$ ion from the threefold degenerate lowest level $^4T_1(^4G)$ (pulled down by the crystal field removing degeneracy due to lack of symmetry) to the non-degenerate ground state $^6A_1(^6S)$ level formed in the tetrahedral crystal field. The nature of the crystal field in both ZnS and CdS is the same as in both $Mn^{2+}$ are tetrahedrally coordinated.

In comparison with Mn doped CdS arrangement similar conditions are created as in the case of ZnS but with a stronger crystal field causing a red shift in the $Mn^{2+}$ intra-level transition leading to red emission. A broadening in the PL spectra is observed due to the fluctuations created in the $Mn^{2+}$ level by the crystal field.

Figure 6C:
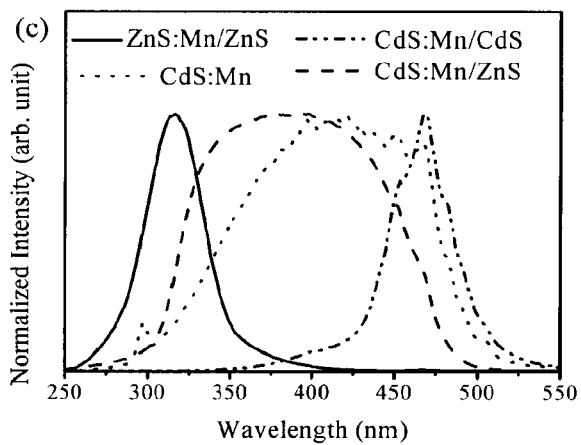
FIG. 6c shows the photoluminescence excitation (PLE) spectra of ZnS:Mn, ZnS:Mn/ZnS, CdS:Mn and CdS:Mn/CdS QDots.

The PL intensity increases for the CdS:Mn QDots after coating with the CdS shell layer but the enhancement was even better for the ZnS shell layer. Thus although these observations failed to highlight the exact reason behind the PLE peak broadening but it is clear that it is not due to size distribution. On the other hand the PL peak position shift for the CdS:Mn/ZnS QDots compared to those of CdS:Mn and CdS:Mn/CdS QDots clearly indicated a change in the Mn environment within the CdS:Mn/ZnS QDots. That means there could be two types of changes—either the Mn atoms are diffused to the ZnS shell layer or Zn atoms are diffused to the core CdS layer to change the Mn atmosphere. The normalized PLE spectra of the CdS:Mn, CdS:Mn/CdS, ZnS:Mn/ZnS and CdS:Mn/ZnS QDots exhibited in FIG. 6c clearly shows that the $Mn^{2+}$ ions within the CdS:Mn/ZnS QDots are neither in the pure ZnS environment nor in the CdS environment. To investigate the Mn environment in the CdS:Mn/ZnS QDots, a series of alloy semiconductor QDots in both uncoated ($Cd_xZn_{1-x}S$:Mn) and coated form ($Cd_xZn_{1-x}S$:Mn/ZnS) are synthesized under the identical experimental conditions.

The PLE and PL spectra of these samples are depicted in FIGS. 7a-7d. The PLE spectra of the uncoated $Cd_xZn_{1-x}S$:Mn QDOTS depicted in FIG. 7a revealed the formation of a series of band gap tunable alloy semiconductor QDots through reverse microemulsion method. The spectra show a gradual blue shift in the PLE spectra with changing compositions from pure CdS to pure ZnS. The bluk band gap of CdS is 2.4 eV and that of the ZnS is ~3.7 eV and both of them possessed identical crystal structure with Zn and Cd atoms in the tetrahedral coordination sites.

The ionic radii of $Cd^{2+}$ and $Zn^{2+}$ are very close to each other. These parameters make it easy to make a solid solution of CdS and ZnS phase in various compositions and tune the band gap within the two extreme limits. In addition to the gradual red shift in the PLE spectra of the $Cd_xZn_{1-x}S$:Mn QDots with increasing x values another interesting observation drawn from is the gradual broadening of the PLE peaks with the increase in x value. Since all the samples were synthesized under the same experimental conditions including the W values, it is very unlikely that variation in the Cd/Zn ratio will introduce a systematic size distribution. Thus, the broadening in the comparatively lower band gap CdS QDots could be something else not the size distributions.

The PL spectra of the uncoated $Cd_xZn_{1-x}S$:Mn QDots are depicted in FIG. 7b. The figure shows that the PL peak position for the samples remained almost unchanged at ~592 nm for x value up to 0.5 but exhibits a gradual red shift thereafter.

FIGS. 7c and 7d show the PLE and PL spectra of the $Cd_xZn_{1-x}S$:Mn/ZnS QDots. The PLE spectra of the core/shell QDots showed systematic redshifts with increasing x values but the PL peak position remained unaltered. Thus, comparing all these PLE and PL spectra we can conclude that the Mn environment in the CdS:Mn/ZnS quantum dots are neither pure CdS nor pure ZnS but $Cd_xZn_{1-x}S$ with x value less than or equal to 0.5. Thus we propose that, in core/shell QDots, the core/shell boundary was not atomically distinct but an auto-generated intermediate alloy layer formed by diffusion of the cations from the core and shell layer.

Figure 8:
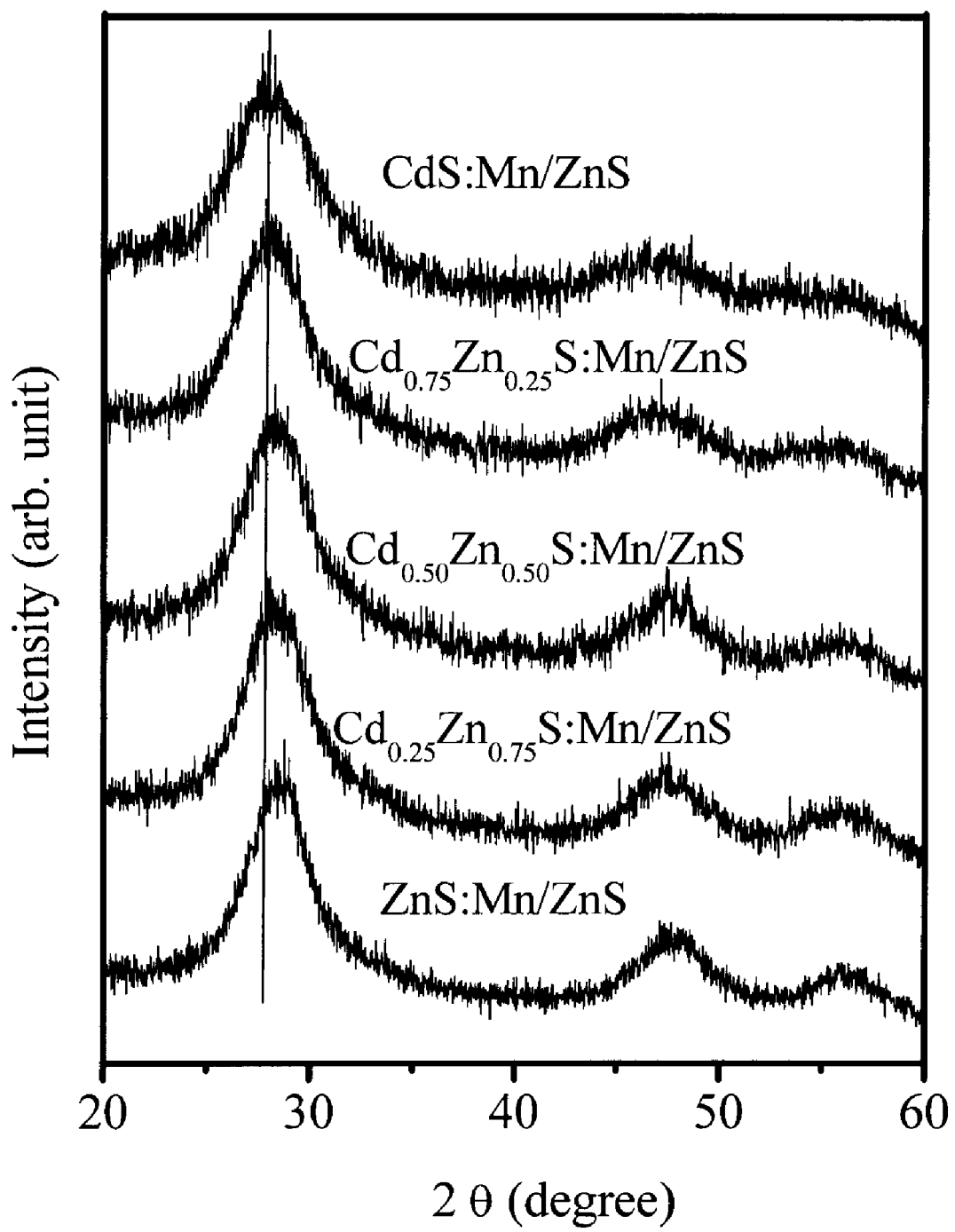
FIG. 8 is the X-ray diffraction pattern showing direct evidence of core alloying. The legend shows the Qdot alloy composition.
Figure 9:
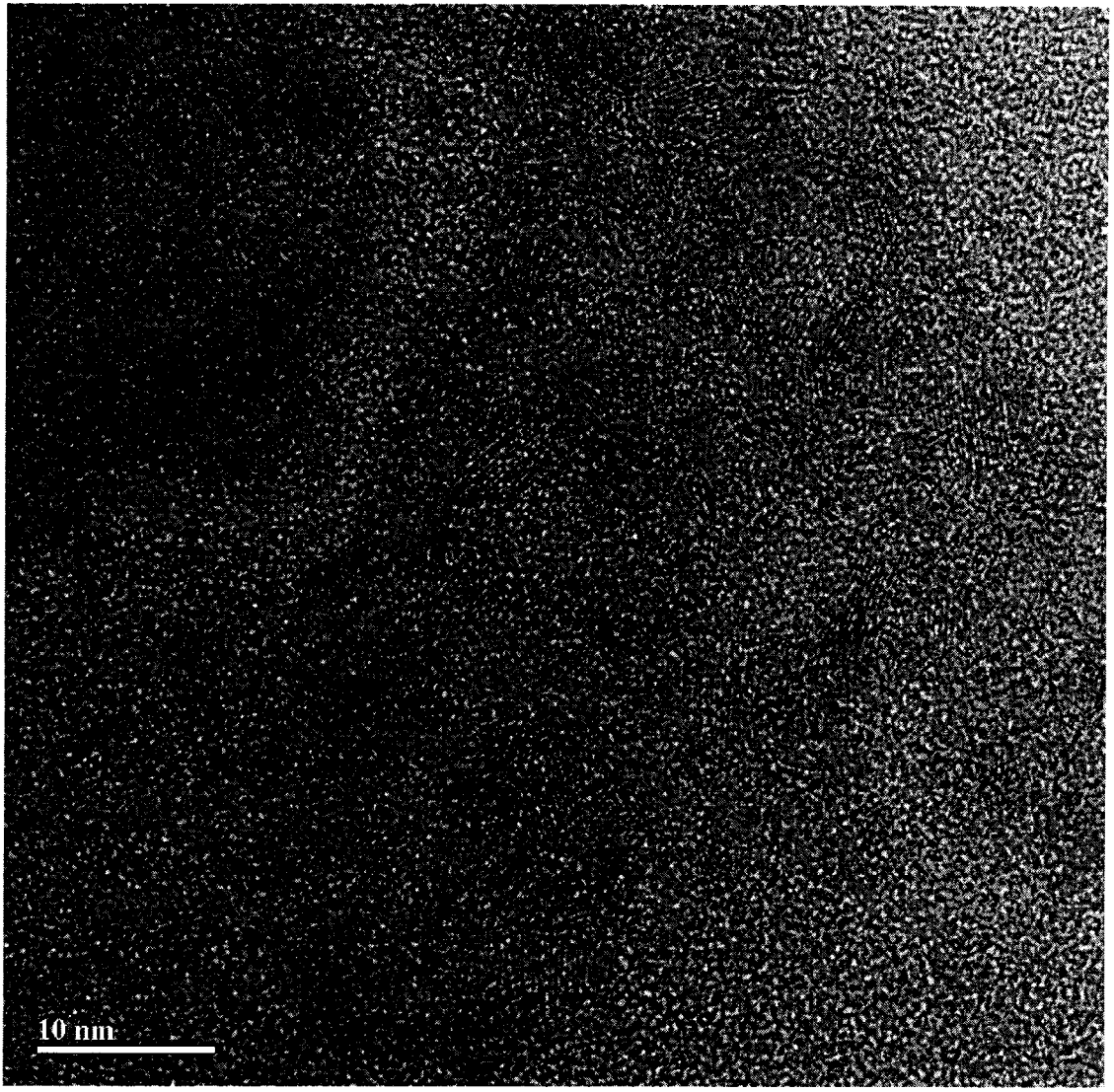
FIG. 9 shows a representative high resolution transmission electron microscopic (HRTEM) image of one representative core/shell/shell Qdot.

FIG. 8 is the X-ray diffraction pattern showing direct evidence of core alloying. The gradual shift of the XRD peak indicated the core alloying. The legend shows the Qdot core composition. FIG. 9 shows a representative high resolution transmission electron microscopic (HRTEM) image of one representative core/shell/shell Qdot.

Nag et al. in *J. Am. Chem. Soc* 2008 (in press, DOI: 10.1021/ja801249z) has recently reported that due to the differences in the ionic radii of the cations, MnS phase possessed lattice mismatch with the CdS and ZnS phase, which make it difficult to dope phase pure CdS or ZnS with higher concentration of Mn.

The $Cd_{0.51}Zn_{0.49}S$ phase possessed quite identical lattice parameter to that of the MnS phase and therefore Mn could be easily doped in the $Cd_{0.51}Zn_{0.49}S$ alloy nanocrystals. The lattice mismatch induced lattice strain ejects the Mn atoms from the central CdS core of the QDots towards the surface in order to relax the lattice strain. The surface bound Mn atom then found the auto generated lattice matched alloy phase as the host. Thus we propose a $CdS/Cd_xZn_{1-x}S$:Mn/ZnS model in place of the traditional CdS:Mn/ZnS model. This new model further supports our experimental evidences as we have observed a blue shift in the PLE spectra of the CdS:Mn/ZnS QDots compared to that of the CdS:Mn QDots.

As Cd and Zn atoms on either side of the interface exchange their position through diffusion to form the intermediate $Cd_xZn_{1-x}S$ alloy layer, the effective core diameter gets reduced resulting in the blue shift in the PLE spectra.

In summary, we have experimentally established the formation of a alloy $Cd_xZn_{1-x}S$ layer at the interface of the traditional CdS:Mn/ZnS QDots providing a new $CdS/Cd_xZn_{1-x}S$:Mn/ZnS core/shell/shell model for the conventional core/shell model. In the process of establishing the new concept of core/shell/shell structure we have synthesized a series of dopant based alloy $Cd_xZn_{1-x}S$:Mn and $Cd_xZn_{1-x}S$:Mn/ZnS quantum dots via the water-in-oil reverse microemulsion methods. The core engineering led to a new type of Qdots where the Mn ions have a microenvironment of bivalent Cd, Zn and S ions, a tertiary alloy core, showing new photophysical characteristics.

Synthesis

The core/shell $Cd_xZn_{(1-x)}S$:Mn/ZnS Qdots were synthesized using a water-in-oil (W/O) microemulsion method, consisting of dioctyl sulfosuccinate, sodium salt (AOT, surfactant), water, and heptane following a published protocol in the literature; H. Yang et al. in *Applied Physics Letters* 2003, Vol. 82, 1965-1967 and H. Yang et al in *Advanced Functional Materials* 2004, Vol. 14, 152-156, incorporated herein by reference.

To create $Cd_xZn_{(1-x)}S$:Mn alloy core, a calculated amount of zinc, cadmium and manganese acetates were taken in one microemulsion and sulfide ion source in another microemulsion. Upon combining the two microemulsions a Qdot alloy core is formed.

The zinc sulfide shell layer was then grown by further adding appropriate amount of zinc source. We purposely took a surplus amount of sulfur ion source to complete the core as well as the shell formation.

As a result of the above described alloying of Cd and Zn for the QDot core, a series of excitation band-gap tunable core-shell $Cd_xZn_{(1-x)}S$:Mn/ZnS QDots are created. When x=0, we obtained pure ZnS:Mn/ZnS core-shell QDots with highest excitation band-gap energy and similarly the lowest excitation band-gap energy was obtained with x=1. The photoluminescence excitation (PLE) of the dopant based core-shell QDots of the present invention is shown in FIG. 7c and photoluminescence (PL) spectra of the core-shell QDots of the present invention are shown in FIG. 7d.

FIG. 7c is the photoluminescence excitation spectra showing direct evidence of excitation wavelength tuning of dopant based core-shell QDots. The inset shows the QDot core composition. An alloy core composition with $Cd_{0.9}Zn_{0.1}S$ showed the broadest excitation spectrum in a wavelength range between approximately 275 nm and approximately 490 nm. This excitation spectrum predicts that this will be a great material for efficient capturing of solar energy for solar cell applications. Also, for bioimaging applications, this wide absorption band will provide flexibility in selecting appropriate excitation wavelengths. The PLE spectrum of ZnS:Mn/ZnS QDots was much narrower with a full width half maxima (FWHM) value 38 nm positioned at 318 nm. With the increase of x value, we observed that the excitation band maximum shifted continuously towards the higher wavelength. Interestingly, we also observed an unusual broadening of excitation band with the increase of x value. The FWHM of the PLE spectrum for the CdS:Mn/ZnS QDots (i.e. x=1) was ~123 nm. The change of the x value from 0 to 1, however did not alter the ~590 nm PL peak position, thus resulting in the formation of excitation band-gap tunable QDots.

The bright photoluminescence (PL) emission shown in FIG. 7d is attributed to the $Mn^{2+}$ $^4T_1 \Rightarrow {}^6A_1$ d-d ligand-field transition, suggesting robust surface passivation of the QDot core by the epitaxially matched ZnS shell layer. The legend for FIG. 7d shows the QDot core composition. Since all the phases of CdS, ZnS and $Cd_xZn_{(1-x)}S$ have identical crystal structures, the $Mn^{2+}$ d-levels experienced similar crystal field and therefore PL emission wavelength remained unchanged. Another way of stating the prior phenonenom, since the emission is originated from the Mn dopant excited state, as expected no emission wavelength shift is observed. Since all the samples were excited at 355 nm, as expected, we observed change in PL intensity with the x values.

Thus, unusual PLE peak broadening is due to alloying of QDot core. Since all the QDot materials were synthesized under identical microemulsion conditions, except the core composition, the crystallite size and size distribution will be very similar. Thus the large PLE peak broadening for higher x values could not be attributed to the QDot size distribution. The PLE spectrum of the ZnS:Mn/ZnS Q-dots was quite sharp and almost gaussian in nature. With the increase in the x values, the PLE spectra gradually broadened and deviates from the Gaussian shape. At higher x values, we anticipate formation of at least two radially distributed crystalline microenvironments of hetero nanostructures, such as the $Cd_xZn_{(1-x)}S$ alloy of the present invention with different band gaps around $Mn^{2+}$ ions, each contributing to the PLE spectrum. As a result, we observed unusual PLE peak broadening.

Based on experimental findings herein, the formation of interfacial alloy layer of $Cd_xZn_{(1-x)}S$ is possibly justified in between CdS core and ZnS shell layer.

The QDot sizes were determined from the high resolution transmission electron microscopy (HRTEM) and average particle sizes were determined as 3-4 nm in diameter for all core-shell compositions. The overall core-shell particle size is less than 3.5 nm in diameter where the core is about 2.7 nm in diameter.

The present invention is a bright yellow-emitting CdS:Mn/ZnS core-shell QDot with absorption maxima at 355 nm wavelength, as reported by H. Yang in *Appl. Phys. Lett.* 2003, Vol. 82, 1965 and S. Santra et al. in *J. Am. Chem. Soc.* 2005, Vol. 127, 1656. The reported excitation wavelength is in the UV range, limiting their wide application in cellular imaging. The present invention provides a core/shell/shell alloy semiconductor with $Cd_xZn_{(1-x)}S$ inner shell and ZnS outer shell allowing the fine tuning of excitation band-gap, covering a wide range (from 2.4 eV to ~4 eV). When doped with Mn, these alloy QDots emit bright yellow/orange light.

A successful method and fabrication of broad excitation band-gap tunable $Cd_xZn_{(1-x)}S:Mn/ZnS$ alloy semiconductor core/shell/shell QDots using a water-in-oil microemulsion technique is provided for the first time. Experimental evidence supports a core/shell (interface)/shell model instead of a traditional core-shell model.

The synthesis strategy can be extended to other semiconductor based QDots to obtain new optical, magnetic and spintronic properties. The quantum dots (QDots) of the present invention are appropriate for use in devices, apparatus, systems, and methods for measuring, analytical and diagnostic fields, including, but not limited to, electronics, optoelectronics and bioimaging, spintronics, computers, and the like.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for fabricating a dopant based core/shell/shell semiconductor having a quantum dot core with a tunable excitation band-gap consisting of the steps of:
    selecting an acetate precursor of semiconductor materials having identical crystal structures with minimal lattice mismatch;
    adding a bivalent transition metal ion as a dopant;
    mixing the acetate precursor of semiconductor material and bivalent transition metal ion dopant in a first water-in-oil emulsion at room temperature;
    mixing a sulfide ion source in a second water-in-oil emulsion at room temperature;
    combining the first water-in-oil emulsion with the acetate precursor of semiconductor material and bivalent transition metal with the second water-in-oil emulsion containing the sulfide ion source, at room temperature to form a quantum dot (Qdot) alloy core; and growing an outer semiconductor material shell layer about the Qdot core to form a ternary alloy core/shell dopant based quantum dot semiconductor said semiconductor comprising: an alloy of cadmium sulfide (CdS) and zinc sulfide (ZnS) semiconductor materials to form a core; a concentric layer composed of in-situ formed $Cd_xZn_{(1-x)}S$ alloy embedded with the dopant manganese (Mn) forming an inner shell surrounding the core; and an outer shell of zinc sulfide (ZnS).

2. The method of claim 1, wherein the precursor materials are selected from at least one of zinc acetate, cadmium acetate and manganese acetate.

3. The method of claim 1, wherein the sulfide ion source is selected from sodium sulfide.

4. The method of claim 1, wherein the bivalent transition metal ion dopant is selected from at least one of manganese (Mn), cobalt, (Co), and nickel (Ni).

5. The method of claim 4, wherein the bivalent transition metal ion dopant is manganese (Mn).

6. The method of claim 1, wherein the average size of the ternary alloy core/shell dopant based quantum dot semiconductor is in a range between 3 nm and 4 nm in diameter.

* * * * *